United States Patent [19]

Danos

[11] Patent Number: 4,891,521
[45] Date of Patent: Jan. 2, 1990

[54] PHOTON COUNTING STRUCTURE AND SYSTEM

[76] Inventor: Michael Danos, 4820 Hutchins Pl., Washington, D.C. 20007

[21] Appl. No.: 110,444

[22] Filed: Oct. 20, 1987

[51] Int. Cl.$^4$ .............................................. H01L 27/14
[52] U.S. Cl. ........................... 250/370.09; 250/370.08; 250/370.10; 250/370.14; 357/30
[58] Field of Search .......... 250/370 R, 370 E, 370 H, 250/370 G, 370 K, 338 A; 357/30 F, 30 G, 30 H, 30 R, 58

[56] References Cited

U.S. PATENT DOCUMENTS

| | | | |
|---|---|---|---|
| 3,873,828 | 3/1975 | Hunsperger et al. | 250/492.1 |
| 4,009,058 | 2/1977 | Mills | 357/30 |
| 4,107,724 | 8/1978 | Ralph | 357/1 |
| 4,190,851 | 2/1980 | Finnila et al. | 250/338.4 |
| 4,229,651 | 10/1980 | Danos | 378/6 |
| 4,445,036 | 4/1984 | Selph | 250/370 |
| 4,472,728 | 9/1984 | Grant et al. | 250/370 |
| 4,580,155 | 4/1986 | Tsoi et al. | 357/30 |
| 4,603,258 | 9/1986 | Sher et al. | 250/338.4 |
| 4,613,756 | 9/1986 | Iwanczyk et al. | 250/370 |
| 4,688,067 | 8/1987 | Rehak et al. | 250/370.10 |
| 4,689,649 | 8/1987 | Sato et al. | 250/370.14 |

Primary Examiner—Janice A. Howell
Assistant Examiner—William F. Rauchholz
Attorney, Agent, or Firm—Shlesinger & Myers

[57] ABSTRACT

A detector for counting low levels of photons comprises a plurality of thin solid state wafers of a photons sensitive material such as gallium arsenide; the wafers being of the order of one-tenth to two millimeter thick depending upon use, and providing a depletion layer of 2 to 20 millimeters deep depending upon the energy of the photons to be detected. The electrical length of the wafer depends upon the use for which the panel is designed and may be one-tenth to two millimeters if two dimensional analysis is desired. Some of the wafers depending upon their materials have a region beyond the 2 to 20 millimeter depth in which is formed an integrated circuit including a detector, preamplifier, discriminator, scaler and read out buffer, each responsive to a different multiplexed, digitized address word. The wafers are connected as PIN diodes and are properly biased for such function. Those wafers using materials on which IC cannot be formed are connected to ICs by leads.

12 Claims, 1 Drawing Sheet

PHOTON COUNTING STRUCTURE AND SYSTEM

The present invention relates to photon detectors and more particularly to an apparatus for counting very low levels of photons.

In many applications of X-rays where photons are to be detected, charge coupled devices ("CCDs") are currently employed. Where, however, very low numbers of photons are to be detected, the analog nature of CCDs renders them inaccurate to a degree not acceptable where highly accurate measurements of low photon fluxes are required. Specifically, CCDs being analog devices not only involve statistical averaging, but averaging per se is also involved and causes further inaccuracy. In order to have as much as a one percent accuracy at least ten thousand photons are required. If the frequency, that is the energy of the photons vary, as they inevitably do, averaging uncertainties increase and where the photon rates are very low, and thus the average signal is quite low, the effects of a system noise become more important to the point of rendering the information virtually worthless.

BRIEF DESCRIPTION OF THE PRESENT INVENTION

The above stated problems with CCDs as low photon rate detectors can be avoided by employing solid state materials for counting the photons, over, depending on the desired spatial resolution, quite small areas. In order to detect photons under these conditions the detector must have sufficient depth to provide an effective depletion layer for the range of photons energies to be detected.

A typical detector according to the present invention, is a solid state material 0.1 to 2 millimeter in width and 2 to 20 millimeters in depth depending again upon the use for which the device is designed; specifically the energy of the photons to be detected.

The detector is a solid state device and may be silicon, gallium arsenide, mercury or lead iodide, etc. depending upon the degree of absorption power desired. Gallium arsenide and silicon may be used for moderate absorption power, mercury or lead iodide for high absorption power and there are other such solid state materials available for the same and related uses.

The length of a wafer depends upon the use to which the device is to be put. As the detector in U.S. Pat. No. 4,229,651 the wafer would be as long as the detector panel disclosed therein. In mammography the wafer may be a square along the face of the detector; that is, squares of 0.1 by 0.1 millimeter; for chest X-rays 1 by 1 millimeter. Resolution in a detector panel can be adapted to locations on the panel by assembling the panel from wafers of different width. For instance one location on the panel may use 0.1 mm wafers and another location may use a 1 mm wafer.

Since some of the materials of the wafers are solid state materials that can have integrated circuits formed thereon, such as, silicon, gallium arsenide and the like, a region is or may be provided beyond the depletion zone in which is formed an integrated circuit, a chip, having all of the electronics necessary to output the acquired information in a multiplexed format in response to external control signals applied via a control bus. With materials such as the iodides the chip is a separate structure and is connected by appropriate leads to the wafer.

DETAILED DESCRIPTION OF THE INVENTION

Figure 1:
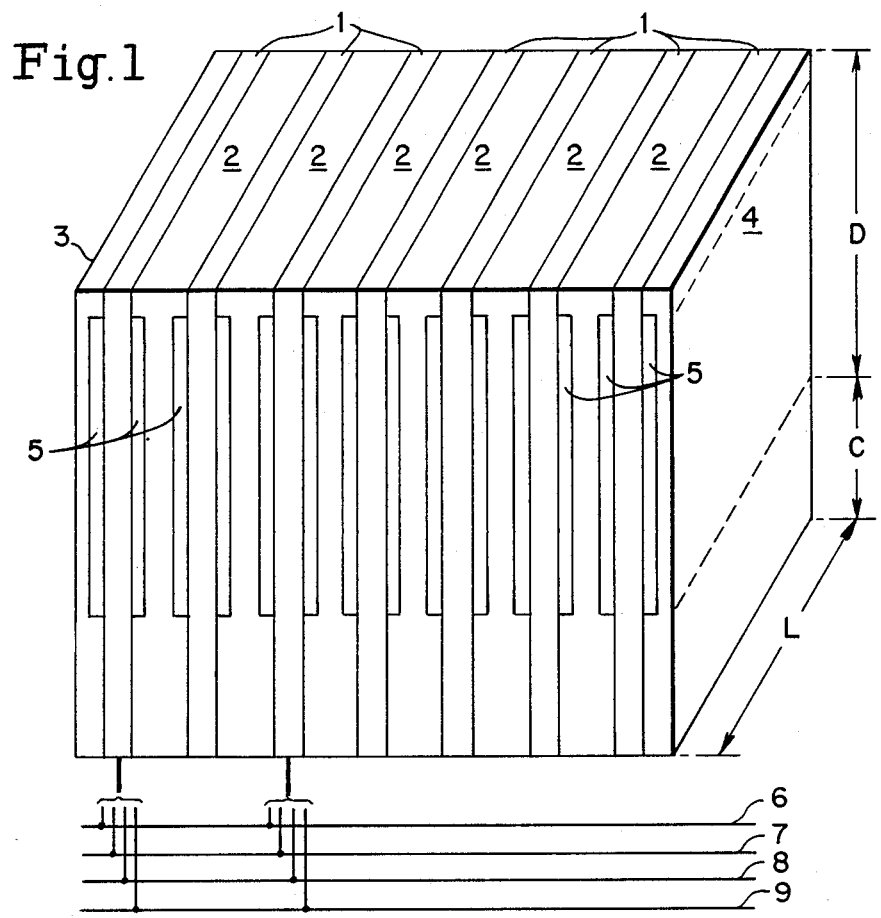
FIG. 1 is a perspective view of a first embodiment of the invention wherein the chip is integral with the wafer.

Referring now specifically to FIG. 1 of the accompanying drawings, there is illustrated one embodiment of the present invention. In this embodiment there are provided seven wafers 1 of semiconductor material insulated from one another by thin layers 2 of insulation. Layers of insulation 3 and 4 cover the side walls of the outer two layers. The insulation layers preferably should not be more than one-tenth the thickness of the wafer. The wafers which function as PIN diodes may be fabricated from silicon in which event the layers of insulation 2, 3 and 4 may be silicon oxide. Suitable insulation materials are available for each of the various wafer materials that may be used. Electrodes 5 are positioned on each side of the wafers under the insulation to apply the required operating voltage to the diodes.

As indicated the width of each wafer, dimension "W" of FIG. 1, is chosen as a function of its intended use and in typical examples vary from 0.1 mm to 2.0 mm. The depth of each layer, the dimension "D" in FIG. 1, is also chosen as a function of use and more specifically as a function of the energy of photons to be detected; the more energy the greater the dimensions D. In typical uses the dimension D may vary from 2 mm to 20 mm. It is usually not advisable that the ratio of depth to width exceed about 20:1 and preferably D should not exceed 10 mm. Exceeding these limits tends to introduce unacceptable cross-talk between the wafers. Region "C" lying below the region D is available in silicon, gallium arsenide and like materials as the basic material for integrated circuits that detect, amplify buffer, scale, etc. and respond to multiplexed buffer address signals to output the photon count from each wafer. A depth C of 2 to 3 mm is ample for such circuits.

The signals applied to the chip apart from bias and collector voltages, are a clock on lead 6, an interrogate signal on lead 7, an on/off signal on lead 8 and an output bus on lead 9. In a typical array approximately 200 wafers may be employed. They are, in typical environments, interrogated once every millisecond; it taking about 10 clock pulses to read out each wafer. A 10 MHz clock is thus suitable. The interrogation signals are digital numbers, each number addressing a different wafer. Lower interrogation rates thus are easily accommodated.

In operation, photons, represented by arrows 11, enter the wafers 1 from the top as illustrated in FIG. 1, are captured by the material of the wafer. The wafer, being a PIN diode, produces electron flow if an "n" type material or a hole flow if a "p" type material. The flow, in form of a pulse, is detected, amplified, etc. and stored in a buffer of the integrated circuit in region C of each wafer. A buffer in the circuit, the chip, counts and stores the count until a signal on lead 7 that is peculiar to a particular wafer is received in conjunction with clock pulses on lead 6. The information stored in the buffer is applied to lead 9. The on/off buss 8 carries, in fact, the various voltages necessary to operate the chip and energize the photon capture region D of the wafer. The bias voltage applied across each wafer may vary typically from 5 to 100 volts and should not exceed 1000 volts, all depending on the material, photon energy and related parameters of the systems. For moderate energy level photons, silicon, gallium arsenide and the like are employed. The iodides and the like are employed for high energy photons.

Figure 2:
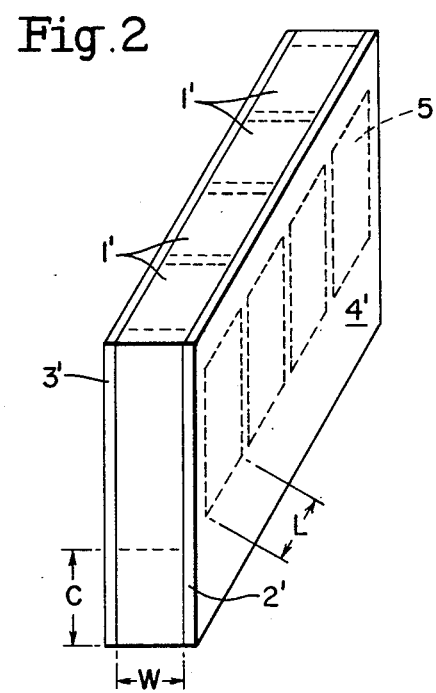
FIG. 2 is a perspective view of a second embodiment of the present invention wherein the chip is integral with the wafer.

The construction illustrated in FIG. 1 is employed where position sensitivity along the Z axis, of the drawings of FIG. 1 the length "L", is not required. If high Z-axis resolution is required the wafers may be electrically divided along the Z-axis as illustrated in FIG. 2; a single width and length of wafer being illustrated therein. The electrical length L of each chip may be of the same size as the width W and in mammography the L & W dimensions for instance may both be 100 microns (0.1 mm); providing resolution equivalent to 50 line pairs per cm. The length of each wafer is defined by a pair of electrodes on the opposed side walls of the solid state wafer 2' of FIG. 2. Each length L of the wafer has its own chip circuitry in the volume L×W×C and is interrogated as indicated in FIG. 1.

In the embodiments illustrated in FIGS. 1 and 2, as previously indicated, the wafers 2 and 2' are fabricated from solid state materials. Thus the circuits necessary to output the information gathered by the wafers to instruments for processing such information can be integral with the wafer. Further the depth D of the wafer may be readily tailored to provide a depletion layer sufficiently thick to capture the photons in a desired energy range.

Figure 3:
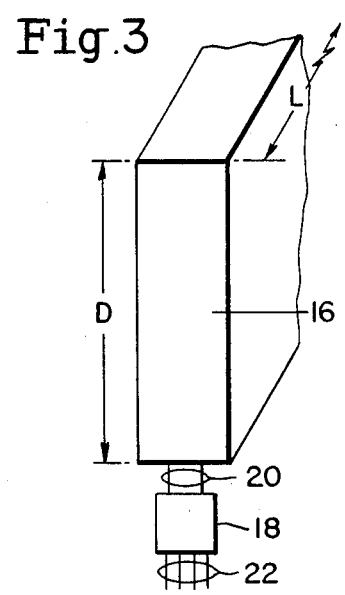
FIG. 3 is a front view of a wafer and a separate chip.

Reference is now made to FIG. 3 of the accompanying drawings wherein the materials employed for the wafer such as the iodides cannot be used in integrated circuits. A wafer 16 has only the W×L×D dimensions of FIG. 1 and FIG. 2, the IC being on a separate chip 18 interconnected with the wafer 16 by various leads 20. The chip 18 is connected to the busses 6–9 by leads 22.

It should be noted that where very high resolution is required, the wafer thickness is about 0.1 mm and a material is used for the wafer on which the IC can be formed directly.

If the structure is to be employed with the camera of my U.S. Pat. No. 4,229,651, then the configuration of FIG. 1 will normally be used with each wafer constituting a detector for a stripe of radiation such as 34a in FIG. 3 of said patent.

Other improvements, modifications and embodiments will become apparent to one of ordinary skill in the art upon review of this disclosure. Such improvements, modifications and embodiments are considered to be within the scope of this invention as defined by the following claims.

What is claimed is:

1. A structure for counting low levels of photons comprising
   a plurality of thin wafers of solid state material stacked in parallel,
   said wafers having a width of 0.1 mm to 2.0 mm perpendicular to the direction of travel of the photons to be detected,
   electrodes disposed on opposed sides of each said wafers and with thin layers of insulation overlying said electrodes,
   said wafers producing a change in an electrical parameter when impinged upon by a photon,
   each said wafer having a depletion region of a depth in line with incident photons to be detected, sufficient to provide depletion of the maximum energy level of photons to be detected,
   a further region of each wafer lying beyond said depletion region providing sufficient volume for an integrated circuit that interfaces with external equipment to provide to such equipment an indication of the number of photons detected by the wafer over a specified period of time, and
   an integrated circuit formed on said further region.

2. A structure according to claim 1 wherein
   the electrical dimension of each said wafer perpendicular to the plane of the width and depth of said wafer is of the same order of magnitude as the width of said wafer.

3. A structure for counting low levels of photon emission comprising
   a plurality of thin wafers of solid state material stacked in parallel,
   said wafers having a width of 0.1 mm to 2.0 mm perpendicular to the direction of travel of the photons to be detected,
   electrodes disposed on opposed surfaces of each said wafer with thin layers of insulation overlying said electrodes,
   means biasing each said wafer to operate as a PIN diode,
   each said wafer having a depletion region generally parallel to the direction of travel of photons to be detected sufficient to capture photons having an energy range of interest,
   said depletion regions being of a maximum depth such that cross-talk between wafers is maintained at a level below a level that effects the accuracy of photon counts.

4. A structure according to claim 2 or claim 3 wherein there are provided a plurality of said wafers exposing a two dimension array of end surfaces along the surface of said structure generally perpendicular to the direction of travel of photons.

5. A structure according to claim 1 or claim 3 wherein
   said depletion regions have a dimension in the direction of travel of the photons to be detected in the range of 2 mm to 10 mm.

6. A structure according to claim 5 wherein
   said thin layers of insulation do not exceed in width one-tenth of the width of said wafers.

7. A structure according to claim 1 or claim 3 wherein the material is silicon.

8. A structure according to claim 1 or claim 3 wherein the material is gallium arsenide.

9. A structure according to claim 3 wherein the material is lead iodide.

10. A structure according to claim 3 wherein the material is mercury iodide.

11. A structure according to claim 1 or claim 3 wherein
    each said depletion region parallel to the direction of travel of the photons to be detected has a dimension of not more than 20 times the width of said wafer.

12. A structure according to claim 1 or claim 3 wherein
    said depletion region has a dimension in the direction of travel of the photons to be detected in the range of 2 mm to 20 mm.

* * * * *